United States Patent
Benjamin et al.

(10) Patent No.: US 7,172,922 B2
(45) Date of Patent: Feb. 6, 2007

(54) CMOS IMAGE SENSOR ARRAY WITH BLACK PIXEL USING NEGATIVE-TONE RESIST SUPPORT LAYER

(75) Inventors: Almog Benjamin, Yuvalim (IL); Hanan Wolf, Moshav Tzrufa (IL); Eyal Shevartzberg, Nazerath-Elite (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 822 days.

(21) Appl. No.: 10/223,914

(22) Filed: Aug. 19, 2002

(65) Prior Publication Data

US 2004/0032518 A1    Feb. 19, 2004

(51) Int. Cl.
*H01L 21/00* (2006.01)
(52) U.S. Cl. .................... 438/75; 257/E31.075
(58) Field of Classification Search ............. 438/48, 438/57, 59, 60, 69, 73, 75; 257/E31.075, 257/E31.081, E31.084, E27.153, E27.154, 257/E27.159, E27.163
See application file for complete search history.

(56) References Cited

U.S. PATENT DOCUMENTS 6,168,965 B1 * 1/2001 Malinovich et al. .......... 438/66
6,187,485 B1 * 2/2001 Matsushima et al. .......... 430/7

FOREIGN PATENT DOCUMENTS

JP        02094566 A  *  4/1990

* cited by examiner

*Primary Examiner*—Brook Kebede
(74) *Attorney, Agent, or Firm*—Bever, Hoffman & Harms, LLP; Patrick T. Bever

(57) ABSTRACT

A "black" pixel for measuring dark current is produced using carbon-based or pigment-based black photosensitive resist deposited on a support layer that is formed using negative-tone photosensitive resist, both being formed over the light sensitive portion of the black pixel. After an array of pixels is fabricated, a negative-tone resist layer is deposited on the upper insulator formed over the pixels, and a region of the negative-tone resist located over the black pixel is exposed using a first mask. A carbon-based resist layer is deposited on the negative-tone resist layer, and a region of the carbon-based resist located over the black pixel is exposed using a second mask. The negative-tone and carbon-based resists are then developed to remove portions of the layers not located over the black pixel.

16 Claims, 5 Drawing Sheets

CMOS IMAGE SENSOR ARRAY WITH BLACK PIXEL USING NEGATIVE-TONE RESIST SUPPORT LAYER

FIELD OF THE INVENTION

The present invention relates to solid state image sensors. More specifically, the present invention relates to a method for fabricating image sensors using black pixels, and to an image sensor fabricated by the method.

BACKGROUND OF THE INVENTION

Solid-state image sensors are used in, for example, video cameras, and are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a liquid crystal display (LCD).

CMOS image sensors first appeared in 1967. However, CCDs have prevailed since their invention in 1970. Both solid-state imaging sensors depend on the photovoltaic response that results when silicon is exposed to light. Photons in the visible and near-IR regions of the spectrum have sufficient energy to break covalent bonds in silicon. The number of electrons released is proportional to the light intensity. Even though both technologies use the same physical properties, all-analog CCDs dominated vision applications because of their superior dynamic range, low fixed-pattern noise (FPN), and high sensitivity to light.

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease image-array cost due to smaller pixels. However, pixels cannot shrink too much, or they have an insufficient light-sensitive area. Nonetheless, shrinking lithography provides reduced metal-line widths that connect transistors and buses in the array.

CMOS pixel arrays are at the heart of the newly developed CMOS image sensors. CMOS pixel-array construction uses active or passive pixels. Active-pixel sensors (APSs) include amplification circuitry in each pixel. Passive pixels use photodiodes to collect the photocharge, whereas active pixels can include either photodiode or photogate light sensitive regions. The first image-sensor devices used in the 1960s were passive pixel arrays, but read noise for passive pixels has been found to be high, and it is difficult to increase the passive pixel array's size without exacerbating the noise. CMOS active-pixel sensors (APSs) overcome passive-pixel deficiencies by including active circuits (transistors) in each pixel.

Figure 1:
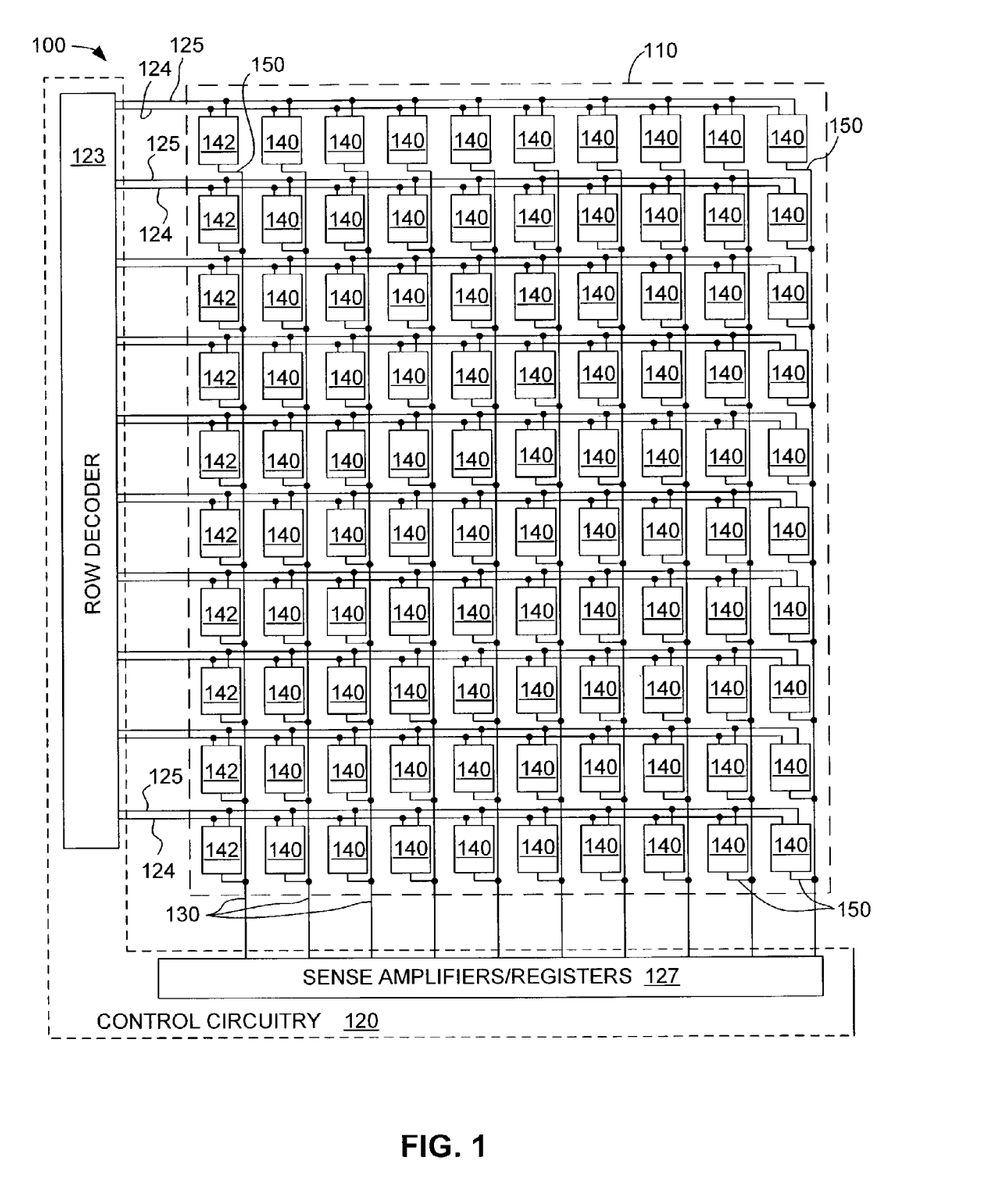
FIG. 1 is a simplified schematic diagram showing a portion of a conventional CMOS APS image sensor circuit.

FIG. 1 shows a CMOS APS image sensor circuit 100 that includes a pixel array 110 and control circuitry 120.

Pixel array 110 includes a closely spaced matrix of APS cells (pixels) 140 and 142 that are arranged in rows and columns, with "black pixel" (masked) APS cells 142 located at the end of each row of pixels 140. Pixel array 110 is depicted as a ten-by-ten array for illustrative purposes only. Pixel arrays typically consist of a much larger number of pixels (e.g., 804-by-1016 arrays), and may include more than one column of black pixel APS cells 142. Moreover, the pixels may be arranged in patterns other than rows and columns. Each APS cell 140 and 142 of pixel array 110 includes a light-sensing element that is capable of converting a detected quantity of light into a corresponding electrical signal at an output terminal 150. However, as discussed below, APS cells 142 are provided with a blocking layer (mask) that prevents light from reaching its light-sensing element. The pixels in each row are connected to a common reset control line 123 and a common row select control line 127. The pixels in each column are connected through respective output terminals 150 to an associated common column data line 130.

Control circuitry 120 includes a row decoder 123 and sense amplifiers/registers 127. A timing controller (not shown) provides timing signals to row decoder 120 that sequentially activates each row of APS cells 140/142 via reset control lines 124 and row select control lines 125 to detect light intensity and to generate corresponding output voltage signals during each frame interval. The timing of the imaging system is controlled to achieve a desired frame rate, such as 30 frames per second in video applications. The detailed circuitry of the row decoder 123, sense amplifiers/registers 127 and timing controller is well known to one ordinarily skilled in the art.

During operation, APS cells 140 are utilized to detect an image, while black pixel APS cells 142 are utilized to adjust for dark currents generated in pixel array 110. When detecting a particular frame, each row of APS cells 140 may be activated to detect light intensity over a substantial portion of the frame interval. In the time remaining after the row of APS cells 140 has detected the light intensity for the frame, each of the respective pixels simultaneously generates output voltage signals corresponding to the amount of light detected by that APS cell 140. If an image is focused on the array 110 by, for example, a conventional camera lens, then each APS cell 140 generates an output voltage signal corresponding to the light intensity for a portion of the image focused on that APS cell 140. The output voltage signals generated by the activated row are simultaneously provided to column output lines 130 via output terminals 150. Column output lines 130 transmit these output voltage signals to sense amplifiers/registers 127.

Figure 2A:
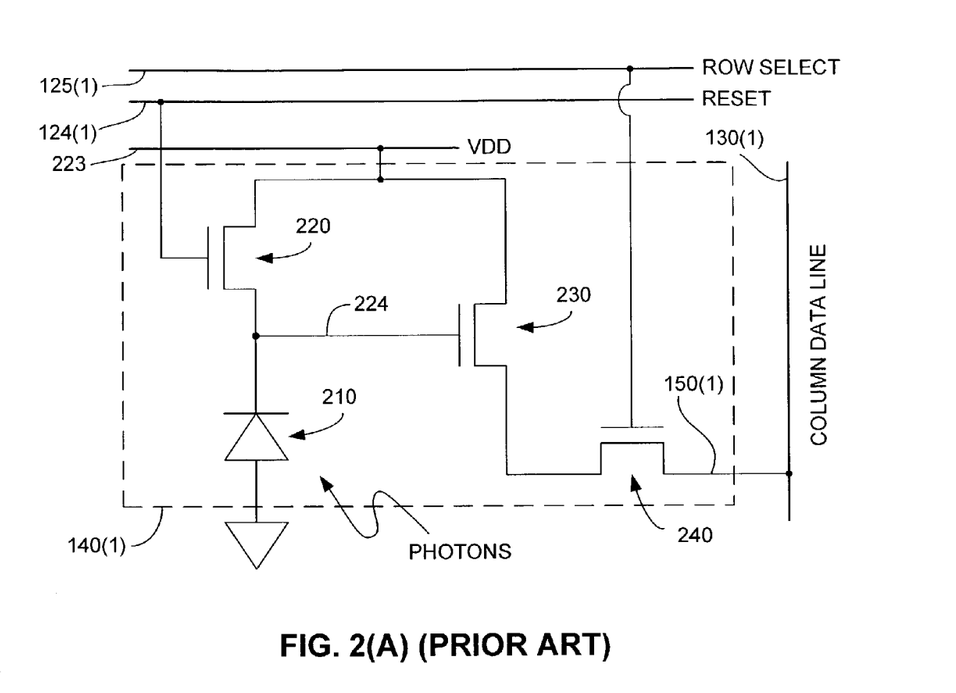
FIGS. 2(A) and 2(B) are simplified schematic and cross-sectional views, respectively, showing a conventional CMOS APS cell of the image sensor circuit shown in FIG. 1.
Figure 2B:
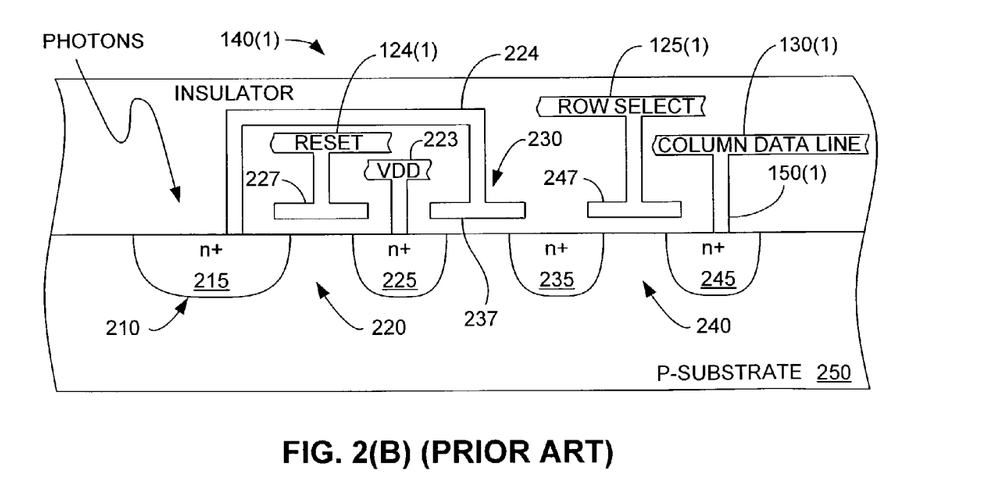

FIGS. 2(A) and 2(B) are simplified schematic and cross-sectional views showing a conventional APS (image sensor) cell 140(1). APS cell 140(1) includes a photodiode 210, a reset transistor 220, an amplifier formed by a source-follower transistor 230, and a select transistor 240. Reset transistor 220 includes a gate connected to reset control line 124 (1), a first terminal connected to a voltage source $V_{DD}$ (e.g., 5 volts) that is transmitted on a voltage source line 223, and a second terminal connected to a terminal of photodiode 210 and to the gate of source-follower transistor 230 via metal line 224. Reset transistor 220 controls integration time and, therefore, provides for electronic shutter control. Source-follower transistor 230 has a first terminal connected to voltage source line 223, a second terminal connected to a first terminal of select transistor 240. Source-follower transistor 230 buffers the charge transferred to column output lines 130 from photodiode 210, and provides current to charge and discharge capacitance on column output lines 130 more quickly. The faster charging and discharging allow the length of column output lines 130 to increase. This increased length, in turn, allows an increase in array size. Select transistor 240 has a gate connected to row select control line 125(1) and a second terminal connected to column data line 130(1) via output terminal 150(1). Select transistor 240 gives half the coordinate-readout capability to the array. Although reset transistor 220, source-follower transistor 230 and select transistor 240 would appear to increase the power consumption of APS cell 140(1) over passive pixel cells, little difference exists between an active and a passive pixels power consumption.

FIG. 2(B) shows a simplified cross-section of conventional APS cell 140(1). APS cell 140(1) is formed in a P-type substrate 250 using known CMOS techniques. Photodiode 210 is formed in a first n-type diffusion (light sensitive) region 215. Voltage source $V_{DD}$ is applied via voltage source line 223 to a second n-type diffusion region 225 that is spaced from photodiode region 215. A first polycrystalline silicon (polysilicon) gate structure 227 is provided over the space between diffusion region 225 and photodiode region 215 and connected to reset control line 124(1) to collectively form reset transistor 220. A third n-type diffusion region 235 is spaced from second region 225, and a second polysilicon gate structure 237 is formed over this space. Photodiode 210 is connected to second polysilicon gate 237 by metal line 224 to form source-follower transistor 230. A fourth n-type diffusion region 245 is spaced from third region 235, and a third polysilicon gate structure 247 is formed over this space and connected to row select control line 125(1) to form select transistor 240. Fourth diffusion region 245 is connected to output terminal 150(1), which in turn is connected to column data line 130(1). APS cell 140(1) is depicted as an n-channel device with electrons as the photo-generated charge carriers. In alternative embodiments (not shown), APS cells may be formed as a p-channel device with holes as the photo-generated charge carriers.

APS cell 140(1) operates in an integration and readout phase that is controlled by signals received on reset control line 124(1) and row select control line 125 (1). Reset transistor 220 is pulsed on and off during the integration phase. This reset process causes the potential of photodiode region 215 to float at a reset level approximately equal to $V_{DD}$ less the threshold voltage of reset transistor 220. Photodiode 210 inherently includes capacitance to store an amount of charge proportional to the light intensity reflected from an object. The photogenerated current discharges the pixel capacitance and causes the potential of the photodiode 210 to decrease from its value of approximately $V_{DD}$ to another value, the signal value, which is dictated by the amount of photogenerated current. The difference between the reset and signal levels is proportional to the incident light and constitutes the video signal. Photodiode 210 is buffered from the output terminal 50 by source-follower transistor 230. Select transistor 240 is used to select the pixel for read-out.

One of the major problems associated with CMOS image sensors is the relatively large dark current intrinsic to the CMOS process. A significant cause of the large dark current is the reverse-bias diode leakage in the photodiode of each a pixel, as well as in the source diffusion of the MOS field effect transistor (MOSFET) connected to the photodiode. The diode leakage is often dominated by the edge leakage currents. Furthermore, in deep-submicron generations of CMOS technology, this leakage current will only increase and take major engineering efforts to suppress. Dark current is also temperature dependent, and therefore tends to drift with changes in the ambient temperature of, for example, a camera containing the CMOS image sensor array.

One approach to dealing with dark current, known as the "black reference" technique, measures the dark currents generated in "black pixels" (APS cells) 142, and uses these measurements to adjust the signal generated by non-masked APS cells 140. As mentioned above, black pixels 142 are standard pixels (e.g., standard APS cells) that are coated or otherwise masked by a black photosensitive resist layer.

Black photosensitive resists are either pigment-based or carbon-based. Carbon-based photosensitive resists have superior light blocking performance in comparison to pigment-based photosensitive resists, which is measured in terms of optical density (OD). For example, a typical carbon-based photosensitive resists has an OD of about 3.0 for a thickness of 1.0 microns, whereas a typical carbon-based photosensitive resist having the same thickness has an OD of about 1.0.

A problem associated with both carbon-based photosensitive resists and pigment-based photosensitive resists is that they are hard to process. For example, carbon-based photosensitive resists are not transparent to I-line (365 nm) or G-line (436 nm) wavelengths, and the carbon particles tend to adhere to the underlying substrate. In some cases, carbon-based photosensitive resists have no process window at all, resulting in cases where both resist lifting and scum problems can occur at the same time. Therefore, conventional methods for processing carbon-based photosensitive resists typically involves setting a process window determined by the exposure dose needed to adhere the resist layer, combined with aggressive developing steps using high-pressure spray and/or increasing the developer temperature to remove unwanted resist areas from the pixel array. These solutions are typically considered too expensive to perform, thereby rendering carbon-based photosensitive resists essentially obsolete in modern CMOS fabrication processing techniques. Similar problems exist in the use of pigment-based photosensitive resists.

What is needed is a cost effective method for fabricating CMOS image sensors that utilizes the beneficial characteristics of carbon-based photosensitive resists (or pigment-based photosensitive resists) that avoids the problems described above.

SUMMARY OF THE INVENTION

The present invention is directed to an image sensor in which a black pixel for measuring dark currents includes a negative-tone photosensitive resist support layer formed between a black photosensitive resist blocking layer (i.e., either a carbon-based or a pigment-based photosensitive resist blocking layer) and a light sensitive region of the black pixel. The support layer increases adhesion of the black photosensitive resist blocking layer to the underlying substrate over the black pixel, thereby avoiding, for example, the resist lifting problems associated with carbon-based photosensitive resists. In regions surrounding to the black pixel (i.e., over "normal" pixels), the negative-tone photosensitive resist and carbon-based resist are developed and removed together, thereby avoiding the scum problems associated with carbon-based resists that, according to conventional methods, are formed directly on the black pixel.

In accordance with an embodiment of the present invention, a method for producing an image sensor including a "black" pixel having a carbon-based photosensitive resist blocking layer begins with by depositing a layer of negative-tone (i.e., non-carbon-based) photosensitive resist over the insulation formed on an array of pixels (or over a color filter structure in the case of color image sensors). In one embodiment, the negative-tone photosensitive resist layer is transparent. A first mask is then used to expose a region of the negative-tone resist layer that is located over the black pixel. A layer of carbon-based photosensitive resist is then formed on the negative-tone resist layer. A second mask is then used to expose a region of the carbon-based resist located over the black pixel (i.e., over the exposed region of the negative-tone resist layer). In one embodiment, a single mask can be used during exposure of both the negative-tone resist and the carbon-based resist. The unexposed portions of the negative-tone resist layer and the carbon-based resist layer are then developed and removed. Scum residue is avoided because the unexposed carbon-based resist is reliably lifted off with the unexposed negative-tone resist. Therefore, the present invention provides a process window for utilizing carbon-based resists as blocking layers in CMOS image sensors, which have otherwise become obsolete due to modern processing techniques.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is described below with reference to specific examples including CMOS black pixel APS cells that are formed using carbon-based photosensitive resist blocking layers. While the present invention is particularly useful in the fabrication of such carbon-based black pixels, similar benefits are also provided when the blocking layer is formed using a pigment-based black photosensitive resist.

Figure 3A:
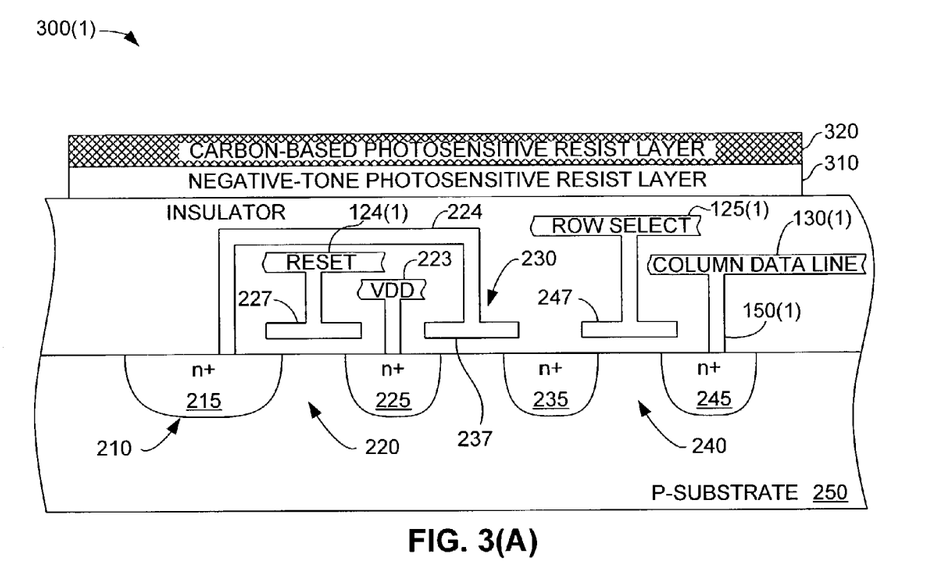
FIGS. 3(A) and 3(B) are simplified cross-sectional views showing APS cells according to alternative embodiments of the present invention.
Figure 3B:
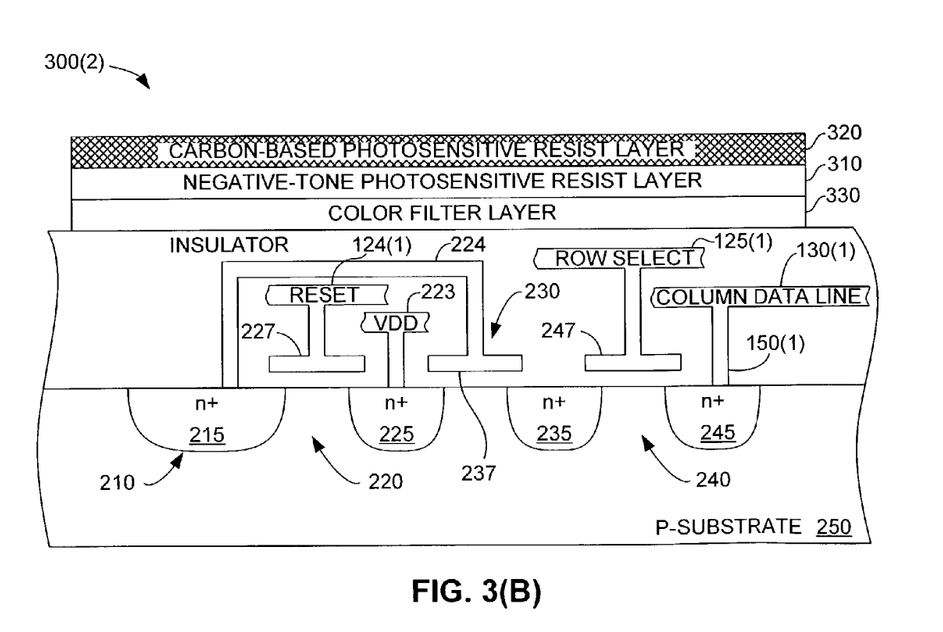

FIGS. 3(A) and 3(B) are cross-sectional side views showing simplified CMOS black pixel APS cells 300(1) and 300(2) according to alternative embodiments of the present invention.

FIG. 3(A) shows a first black pixel APS cell 300(1) including a conventional CMOS APS cell that is masked using a support layer 310 and a blocking layer 320. In particular, APS cell 300(1) a photodiode 210 (n-type light sensitive region 215), a second n-type diffusion region 225 maintained at VDD and coupled to photodiode 210 by a reset transistor 220 formed by gate structure 227, which is connected to reset control line 124(1). A third n-type diffusion region 235 is spaced from second region 225, and a polysilicon gate structure 237 is provided over this space and connected to photodiode 210 to form a source-follower transistor 230. A fourth n-type diffusion region 245 is spaced from third region 235 by a select transistor 240 formed by polysilicon gate structure 247 connected to row select control line 125(1). Fourth diffusion region 245 is connected to output terminal 150(1). Operation of the above-described structure of black pixel APS cell 300(1) is similar to that described above with reference to conventional APS cell 140(1), with the exception that blocking layer 320 prevents light from striking photodiode 320, so that the only current measured at output terminal 150(1) is dark current.

In accordance with the disclosed embodiment, blocking layer 320 of black pixel APS cell 300(1) is formed from carbon-based photosensitive resist using a novel method that includes forming blocking layer 320 on support layer 310, which is formed from negative-tone photosensitive resist (i.e., a photosensitive resist that does not include carbon, such as a transparent photosensitive resist). By forming support layer 310 under blocking layer 320, adhesion of the carbon-based photosensitive material to the underlying structure is increased, thereby avoiding the resist lifting problems typically associated with carbon-based photosensitive resists. In addition, in regions surrounding to black pixel APS cell 300(1), the negative-tone photosensitive resist and carbon-based resist are developed and removed together, thereby avoiding the scum problems associated with carbon-based resists.

FIG. 3(B) shows a second black pixel APS cell 300(2) that is essentially identical to APS cell 300(1), but further includes a color filter layer 330 located between support layer 310 and photodiode 210.

Figure 4A:
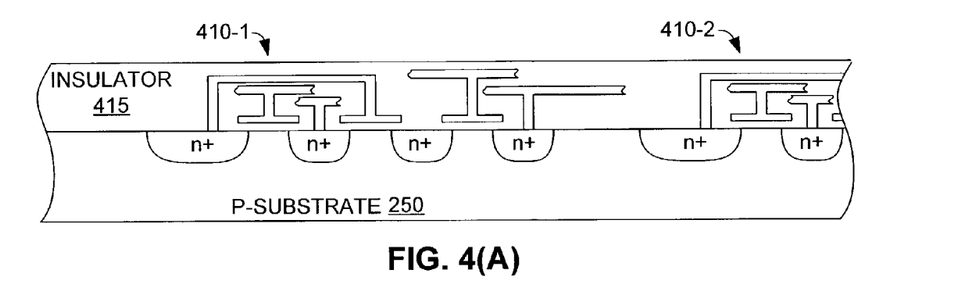
FIGS. 4(A) through 4(F) are simplified cross-sectional views showing a method for producing the image sensor cells according to one embodiment of the present invention.

FIG. 4(A) shows a partially-fabricated CMOS image sensor array 400 including a first CMOS APS cell 410-1 located next to a second CMOS APS cell 410-2 (partially shown) and covered by an insulator layer 415. Each cell 410-1 and 410-2 can be a conventional CMOS APS cell, such as CMOS APS cell 140(1), which is described above with reference to FIG. 2(B). Fabrication of such CMOS APS cells is well known in the art and is omitted herein for brevity.

Figure 4B:
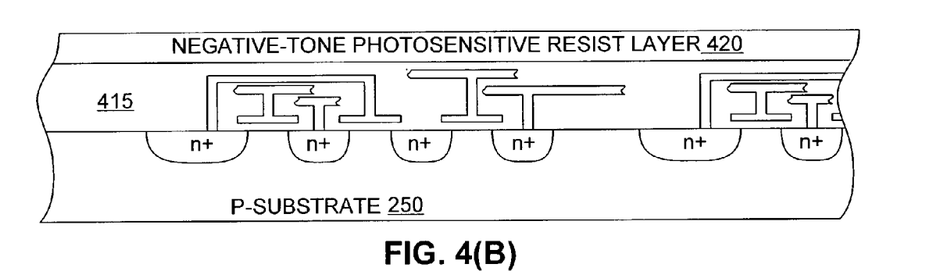

Referring to FIG. 4(B), a negative-tone photosensitive resist layer 420 is deposited over insulation layer 415. In one embodiment, negative-tone photosensitive resist layer 420 comprises a composition including an Acrylic resin, an Acrylic monomer, Glycol Ether ketones, Cyclic ketones, Glycol ethers, esters, and Alkyl benzenes, that is deposited to a thickness of in the range of 0.5 to 1.0 microns. Note that negative-tone photosensitive resist layer 420 does not include Carbon black.

Figure 4C:
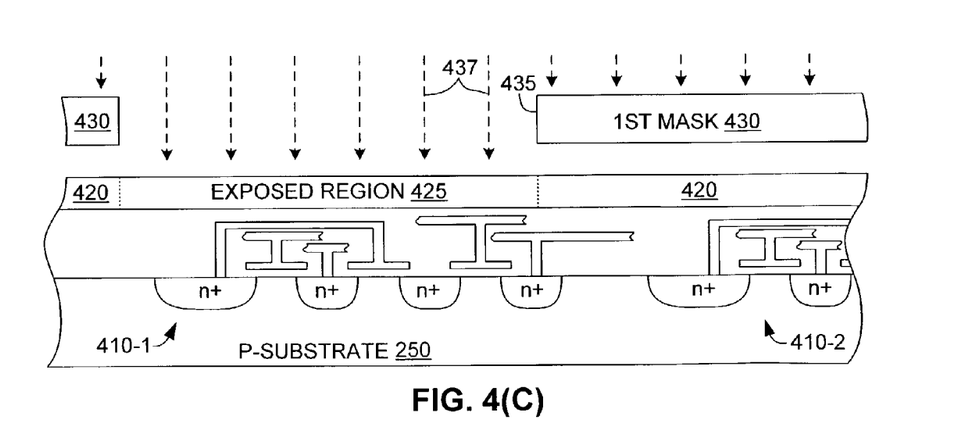

Referring to FIG. 4(C), a first mask 430 is then positioned over negative-tone photosensitive resist layer 420 having a window 435 through which a region 425 of negative-tone photosensitive resist layer 420 is exposed to a light source (indicated by dashed arrows 437). Mask 430 is formed and positioned using conventional methods. In one embodiment, exposure is performed utilizing a light source having an I-line (365 nm) or G-line (436 nm) wavelengths with a dose of 150–700 mJ/cm$^2$. Note that exposed region 425 of negative-tone resist layer 420 is located over CMOS APS cell 410-1, but not over CMOS APS cell 410-2. An optional post-baking step may be employed.

Figure 4D:
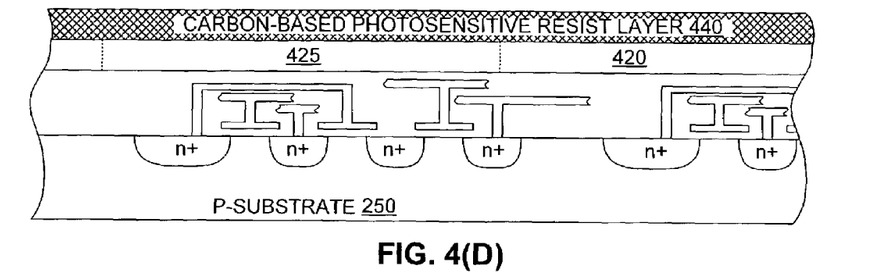

Next, as indicated in FIG. 4(D), a carbon-based photosensitive resist layer 440 is formed on negative-tone resist layer 420. In one embodiment, carbon-based resist layer 440 comprises Carbon black combined with an Acrylic resin, a cross-linking agent, a photo-initiator, cyclic ketones, Glycol ethers, esters, and Alkyl benzenes, and is deposited to a thickness in the range of 1.0 to 2.0 microns. Carbon-based photosensitive resist layer 440 may also include black pigment. The resist thickness is set by controlling the spin speed of the wafer in order to maintain the desired optical density of photosensitive resist layer 440. Note that carbon-based photosensitive resist layer 440 may be replaced by a pigment-based photosensitive resist layer by replacing the Carbon black with a black pigment.

Figure 4E:
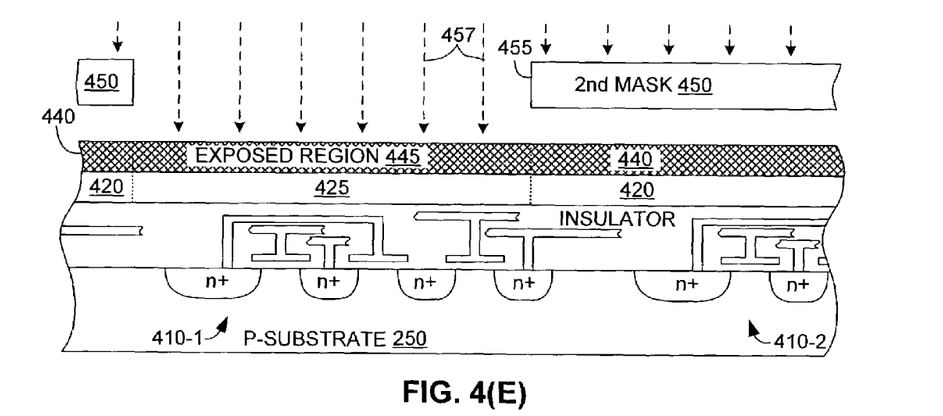

Referring to FIG. 4(E), a second mask 450 is then utilized with a window 455 through which a region 445 of carbon-based photosensitive resist layer 440 is exposed to a light source (indicated by dashed arrows 457). Mask 450 is aligned such that exposed region 445 of carbon-based resist layer 440 is located over exposed region 425 of negative-tone resist layer 420 (i.e., over CMOS APS cell 410-1). Exposure is performed utilizing a light source having the I-line or G-line wavelengths with a dose of 500–1200 mJ/cm$^2$. As with negative-tone resist layer 420, the portion of carbon-based resist layer 440 located over CMOS APS cell 410-2 is not exposed. Note that first mask 430 may also be used in place of a separate second mask 450.

Figure 4F:
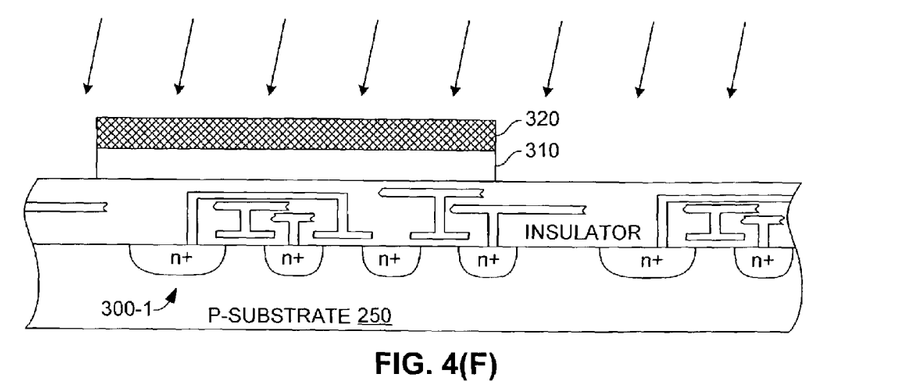

Next, as shown in FIG. 4(F), the unexposed portions of the negative-tone resist layer and the carbon-based resist layer are developed and removed, thereby forming a support layer 425 and blocking layer 445 over APS cell 410-1. This development process consists of common lithography steps. First, the developer is sprayed on the wafer to form a puddle. Next, the spray is stopped to allow the puddle to absorb the non-crosslinked portion of the resist. De-ionized (DI) water is then used to rinse the unwanted resist material from the developer, followed by a high-speed spin to remove the water. The developer consists of diluted amines with water, or Alkaline solution with surfactants. Note that because the removed portions of the carbon-based resist layer are formed on negative-tone resist, which is relatively easy to remove, scum residue is avoided. Further, because the carbon-based resist of blocking layer 445 is formed on a support layer formed without carbon, the resist lifting problems associated with conventional carbon-based resist blocking layers are also avoided. Therefore, although the method of the present invention may require additional processing steps, the present invention provides a process window for utilizing carbon-based resists as blocking layers in CMOS image sensors that have otherwise become obsolete due to modern processing techniques. Finally the blocking layer is baked at 220° C. for 2–4 minutes.

Although the present invention has been described with respect to certain specific embodiments, it will be clear to those skilled in the art that the inventive features of the present invention are applicable to other embodiments as well, all of which are intended to fall within the scope of the present invention. For example, as mentioned above, a black pigment-based photosensitive resist blocking layer may be used in place of the carbon-based photosensitive resist blocking layer described in the specific embodiments disclosed herein, although a thickness of the pigment-based photosensitive resist would necessarily be thicker to provide comparable attenuation. Moreover, in addition to fabricating CMOS APS devices, the disclosed methods may be beneficially utilized to produce CCD image sensors, as well as passive pixel CMOS sensors and other MOS image sensors. Further, the particular parameters set forth in the above examples are exemplary, and may be altered to meet the requirements of particular fabrication processes. Thus, the invention is limited only by the following claims.

The invention claimed is:

1. A method of producing image sensors comprising the steps of:
    producing a plurality of pixels on a substrate including a first pixel located adjacent to a second pixel, each of the pixels including a light-sensitive region;
    forming a non-carbon-based photosensitive resist support layer over the first and second pixels;
    forming a carbon-based photosensitive resist layer on the support layer; and
    removing portions of the support layer and the carbon-based photosensitive resist layer that are located over the second pixel such that a first portion of the support layer is positioned over the first pixel, and a second portion of the carbon-based photosensitive resist layer is positioned on the first portion.

2. The method according to claim 1,
    wherein forming the support layer comprises depositing a negative-tone photosensitive resist layer over the first and second pixels, and then exposing the first portion of the negative-tone photosensitive resist layer through a first mask,
    wherein forming the carbon-based photosensitive resist layer comprises exposing the second portion of the carbon-based photosensitive resist layer through a second mask, and
    wherein removing portions of the support layer and the carbon-based photosensitive resist layer comprises developing unexposed portions of the negative-tone photosensitive resist layer and the carbon-based photosensitive resist layer, and then rinsing away the developed portions of the negative-tone photosensitive resist layer and the carbon-based photosensitive resist layer.

3. The method according to claim 2,
    wherein exposing the first portion of the negative-tone photosensitive resist layer and exposing the second portion of the carbon-based photosensitive resist layer comprise utilizing a light source having an I-line wavelength or a G-line wavelength.

4. The method according to claim 3,
    wherein exposing the first portion of the negative-tone photosensitive resist layer comprises applying an exposure dose of 150–700 mJ/cm$^2$, and
    wherein exposing the first portion of the negative-tone photosensitive resist layer comprises applying an exposure dose of 500–1200 mJ/cm$^2$.

5. The method according to claim 2,
    wherein depositing a negative-tone photosensitive resist layer comprises depositing a transparent photosensitive resist layer.

6. The method according to claim 1,
    wherein forming the support layer comprises depositing a negative-tone photosensitive resist layer over the first and second pixels, and then exposing the first portion of the negative-tone photosensitive resist layer through a mask,
    wherein forming the carbon-based photosensitive resist layer comprises exposing the second portion of the carbon-based photosensitive resist layer through the mask, and
    wherein removing portions of the support layer and the carbon-based photosensitive resist layer comprises developing unexposed portions of the negative-tone photosensitive resist layer and the carbon-based photosensitive resist layer, and then rinsing away the developed portions of the negative-tone photosensitive resist layer and the carbon-based photosensitive resist layer.

7. The method according to claim 6,
    wherein exposing the first portion of the negative-tone photosensitive resist layer and the second portion of the carbon-based photosensitive resist layer comprises utilizing a light source having an I-line wavelength or a G-line wavelength.

8. The method according to claim 7,
wherein exposing the first portion of the negative-tone photosensitive resist layer comprises applying an exposure dose of 150–700 mJ/cm$^2$, and exposing the first portion of the negative-tone photosensitive resist layer comprises applying an exposure dose of 500–1200 mJ/cm$^2$.

9. The method according to claim 7,
wherein depositing a negative-tone photosensitive resist layer comprises depositing a transparent photosensitive resist layer.

10. The method according to claim 1, further comprising forming a color filter layer before the support layer.

11. A method for producing an image sensor comprising:
producing a plurality of pixels on a substrate including a first pixel located adjacent to a second pixel, each of the pixels including a light-sensitive region;
forming a negative-tone photosensitive resist layer over the first and second pixels;
forming a black photosensitive resist layer on the negative-tone photosensitive resist layer; and
removing portions of the negative-tone photosensitive resist layer and the black photosensitive resist layer that are located over the second pixel such that a support portion of the negative-tone photosensitive resist layer is positioned over the first pixel, and a light blocking portion of the black photosensitive resist layer is formed on the support portion.

12. The method according to claim 11,
wherein forming the negative-tone photosensitive resist layer comprises exposing the support portion of the negative-tone photosensitive resist layer through a mask,
wherein forming the black photosensitive resist layer comprises depositing a carbon-based photosensitive resist layer on the negative-tone photosensitive resist layer, and exposing the light blocking portion of the carbon-based photosensitive resist layer through the mask, and
wherein removing portions of the negative-tone photosensitive resist layer and the carbon-based photosensitive resist layer comprises developing unexposed portions of the negative-tone photosensitive resist layer and the carbon-based photosensitive resist layer, and then rinsing away the developed portions of the negative-tone photosensitive resist layer and the carbon-based photosensitive resist layer.

13. The method according to claim 12,
wherein exposing the support portion of the negative-tone photosensitive resist layer and exposing the light blocking portion of the carbon-based photosensitive resist layer comprise utilizing a light source having an I-line wavelength or a G-line wavelength.

14. The method according to claim 13,
wherein exposing the support portion of the negative-tone photosensitive resist layer comprises applying an exposure dose of 150–700 mJ/cm$^2$, and
wherein exposing the light blocking portion of the negative-tone photosensitive resist layer comprises applying an exposure dose of 500–1200mJ/cm$^2$.

15. The method according to claim 12,
wherein depositing a negative-tone photosensitive resist layer comprises depositing a transparent photosensitive resist layer.

16. The method according to claim 11,
wherein forming the negative-tone photosensitive resist layer comprises exposing the support portion of the negative-tone photosensitive resist layer through a mask,
wherein forming the black photosensitive resist layer comprises depositing a pigment-based photosensitive resist layer on the negative-tone photosensitive resist layer, and exposing the light blocking portion of the pigment-based photosensitive resist layer through the mask, and
wherein removing portions of the negative-tone photosensitive resist layer and the pigment-based photosensitive resist layer comprises developing unexposed portions of the negative-tone photosensitive resist layer and the pigment-based photosensitive resist layer, and then rinsing away the developed portions of the negative-tone photosensitive resist layer and the pigment-based photosensitive resist layer.

* * * * *